US008889341B2

(12) United States Patent
Werner et al.

(10) Patent No.: US 8,889,341 B2
(45) Date of Patent: Nov. 18, 2014

(54) NEGATIVE-WORKING LITHOGRAPHIC PRINTING PLATE PRECURSORS AND USE

(75) Inventors: Saija Werner, Hattorf (DE); Harald Baumann, Osterode (DE); Udo Dwars, Herzberg (DE); Christopher D. Simpson, Osterode (DE); Axel Draber, Osterode (DE)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/591,559

(22) Filed: Aug. 22, 2012

(65) Prior Publication Data

US 2014/0057204 A1    Feb. 27, 2014

(51) Int. Cl.
| | |
|---|---|
| G03F 7/00 | (2006.01) |
| G03F 7/26 | (2006.01) |
| B41M 5/00 | (2006.01) |
| B41N 1/00 | (2006.01) |
| B41C 1/10 | (2006.01) |

(52) U.S. Cl.
CPC .................................. B41C 1/1008 (2013.01)
USPC ..................... 430/302; 430/270.1; 430/271.1; 430/273.1; 430/284.1; 430/285.1; 101/450.1; 101/453

(58) Field of Classification Search
CPC .............. G03F 7/00; G03F 7/03; G03F 7/26; B41M 5/00; B41C 1/1008; B41C 1/1016; B41N 1/00
USPC ......... 430/270.1–283.1, 300–302; 101/450.1, 101/453, 463.1
See application file for complete search history.

(56) References Cited

U.S. PATENT DOCUMENTS

| | | | |
|---|---|---|---|
| 5,998,095 | A | 12/1999 | Nagase |
| 7,928,166 | B2 | 4/2011 | Shibutani |
| 2002/0010264 | A1 | 1/2002 | Pappas et al. |
| 2008/0299488 | A1 | 12/2008 | Yu et al. |
| 2009/0253865 | A1* | 10/2009 | Shibutani et al. ............... 525/59 |
| 2010/0009130 | A1 | 1/2010 | Yu et al. |
| 2010/0233445 | A1* | 9/2010 | Simpson et al. ........... 428/195.1 |

FOREIGN PATENT DOCUMENTS

| | | |
|---|---|---|
| EP | 1 951 829 B1 | 12/2009 |
| EP | 2 406 687 A1 | 9/2010 |
| EP | 2 275 258 | 1/2011 |
| EP | 2275258 A2 * | 1/2011 |
| EP | 2 568 339 A2 | 3/2013 |
| JP | 2000313721 A * | 11/2000 |
| JP | 2002-169272 | 6/2002 |
| JP | 2002-241433 | 8/2002 |
| JP | 2004-038088 | 2/2004 |
| JP | 2007-245495 | 9/2007 |
| JP | 2007-256685 | 10/2007 |
| JP | 2009-086514 | 4/2009 |
| WO | 2005/038625 | 4/2005 |

* cited by examiner

*Primary Examiner* — Chanceity Robinson
(74) *Attorney, Agent, or Firm* — J. Lanny Tucker

(57) ABSTRACT

A negative-working lithographic printing plate precursor comprises a negative-working radiation-sensitive imageable layer and an outermost layer comprising a vinyl alcohol copolymer comprising at least one unit of each of the (a), (b), and (c) recurring units, in any order, defined in the disclosure. The (c) recurring units are present in the vinyl alcohol copolymer in an amount of at least 0.5 mol %, based on the total recurring units. These precursors can be used to prepare lithographic printing plates either on-press or off-press after imaging using near-UV, visible, or infrared radiation.

17 Claims, No Drawings

NEGATIVE-WORKING LITHOGRAPHIC PRINTING PLATE PRECURSORS AND USE

FIELD OF THE INVENTION

This invention relates to negative-working lithographic printing plate precursors that can be imaged using suitable radiation to provide lithographic printing plates. These precursors have a unique oxygen barrier topcoat to provide various advantages.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

New UV laser, visible laser, or thermal imaging has become increasingly important in the printing industry because of their stability to ambient light. The imageable elements used for the preparation of lithographic printing plates have been designed to be sensitive to near-UV radiation, visible radiation, or heat or infrared radiation and can be exposed using laser diodes, thermal heads of more usually, infrared laser diodes that image in response to signals from a digital copy of the image in a computer a platesetter. This "computer-to-plate" technology has generally replaced the former technology where masking films were used to image the elements.

These imaging techniques often require the use of water or a developer (neutral to alkaline pH) to remove exposed (positive-working) or non-exposed (negative-working) regions of the imaged layer(s). In some instances, the negative-working lithographic printing plate precursors are designed for development on-press using a suitable fountain solution, lithographic printing ink, or both.

The negative-working precursor can have a water-soluble or water-dispersible overcoat (also sometimes known as an "oxygen impermeable topcoat" or "oxygen barrier layer") disposed over the negative-working radiation-sensitive imageable layer. The topcoat can be the outermost layer. Such overcoat layers can comprise one or more water-soluble poly(vinyl alcohol)$_s$. Details about such overcoats are provided in WO 99/06890 (Pappas et al.) and U.S. Pat. No. 5,998,095 (Nagase).

EP Publication 2,275,258A2 (Oohashi et al.) describes lithographic printing plate precursors having overcoat layers that comprise a modified poly(vinyl alcohol) having alkylene oxide or amino groups. Anionic modified poly(vinyl alcohol) are described in overcoat layers in JP Publication 2007-245, 495 (Endo).

As noted above, imaged lithographic printing plate precursors are processed or developed in some manner to remove appropriate regions of the imageable layers. In the case of negative-working precursors that generally include a protective overcoat, the non-imaged (non-exposed) regions are removed by processing. In most uses, the protective overcoats are removed by a separate water wash step followed by a developing step using a separate developer bath to remove the non-image areas of the imaged layer. In general, processing is carried out using specific processing solutions that are designed to remove or solubilize specific imaging chemistry. If the processing solution is not designed properly for a specific imaged precursor, the presence of a water-soluble protective overcoat having high oxygen barrier efficiency (for example using a polymer comprising vinyl alcohol units) causes the formation of undesirable sludge formation of sludge or debris in the processor tank and rollers occurs when the imaged precursor is processed without a separate wash step before development, especially as the developer loading increases.

As a result, material can be deposited on non-image regions of the lithographic printing plate resulting in difficulties in printing start up or dirty printed impressions. Furthermore, the length of a loading cycle is low because it is limited by the poor solubility of the protective overcoat material, and the cleaning efforts in the processor are increased if the protective overcoat is not washed off in a separate wash step.

There is a need for an improved negative-working lithographic printing plate precursor that has a protective overcoat having a high oxygen barrier efficiency (low oxygen permeability results in good latent image keeping), high solubility of the overcoat material in the processing solutions, good scratch resistance, and good protective overcoat adhesion to the underlying imageable layer. It is known that poly(vinyl alcohol) (PVA) has low oxygen permeability especially if it has high degree of saponification (that is, low amount of vinyl acetate residues). Highly saponified PVA is known to have very low water-solubility. The solubility of highly saponified PVA in processing solution that are suited for imageable layers is even worse than its solubility in water because of its high content of salts, surfactants, solvents, and other components. There is a need to solve this problem for negative-working lithographic printing plate precursors.

SUMMARY OF THE INVENTION

The present invention provides a negative-working lithographic printing plate precursor comprising a substrate, and comprising on the substrate:

a negative-working radiation-sensitive imageable layer comprising a free radically polymerizable compound, a radiation absorber, a compound to generate free radicals upon irradiation, and a polymeric binder, and disposed over the negative-working radiation-sensitive imageable layer, an outermost layer comprising a vinyl alcohol copolymer comprising at least one unit of each of the following (a), (b), and (c) recurring units, in any order:

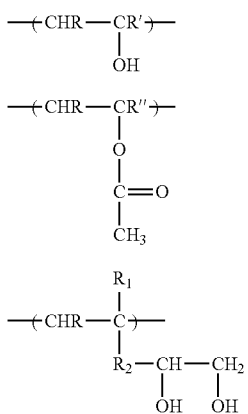

wherein R, R', and R" are independently hydrogen or a substituted or unsubstituted alkyl group having 1 to 4 carbon atoms, $R_1$ is hydrogen or a substituted or unsubstituted alkyl group having 1 to 4 carbon atoms, $R_2$ represents a single connecting bond or a substituted or unsubstituted alkylene or cycloalkylene group, wherein the (c) recurring units are present in an amount of at least 0.5 mol %, based on the total recurring units in the vinyl alcohol copolymer.

In some embodiments, the negative-working lithographic printing plate precursor comprising a grained and anodized aluminum-containing substrate, and comprising on the substrate:

a single negative-working radiation-sensitive imageable layer comprising a free radically polymerizable compound, an infrared radiation absorber, an onium compound to generate free radicals upon irradiation, and a polymeric binder, and disposed directly on the negative-working radiation-sensitive imageable layer, an outermost layer comprising a vinyl alcohol copolymer comprising at least one unit of each of the following (a), (b), and (c) recurring units, in any order:

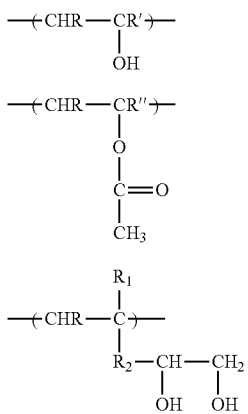

wherein R, R', and R" are independently hydrogen or a methyl group, $R_1$ is hydrogen or a methyl group, $R_2$ is a single connecting bond or a substituted or unsubstituted alkylene group having 1 to 3 carbon atoms, based on the total recurring units in the vinyl alcohol copolymer, wherein the (a) recurring units are present in an amount of at least 70 mol % and up to and including 98.9 mol %, the (b) recurring units are present in an amount of at least 0.1 mol % and up to and including 20 mol %, and the (c) recurring units are present in an amount of at least 1 mol % and up to and including 10 mol %, the vinyl alcohol copolymer is present in the outermost layer in an amount of at least 60 weight % and up to and including 100 weight %, based on the total outermost layer dry weight, and the outermost layer is present in a dry amount of at least 0.2 g/m² and up to and including 2.5 g/m².

In some other embodiments, the negative-working lithographic printing plate precursor comprising a grained and anodized aluminum-containing substrate, and comprising on the substrate:

a single negative-working radiation-sensitive imageable layer comprising a free radically polymerizable compound, a sensitizer for imaging radiation of at least 350 nm to and including 450 nm, a compound to generate free radicals upon irradiation to imaging radiation of at least 350 nm to and including 450 nm, and a polymeric binder, and disposed directly on the negative-working radiation-sensitive imageable layer, an outermost layer comprising a vinyl alcohol copolymer comprising at least one unit of each of the following (a), (b), and (c) recurring units, in any order:

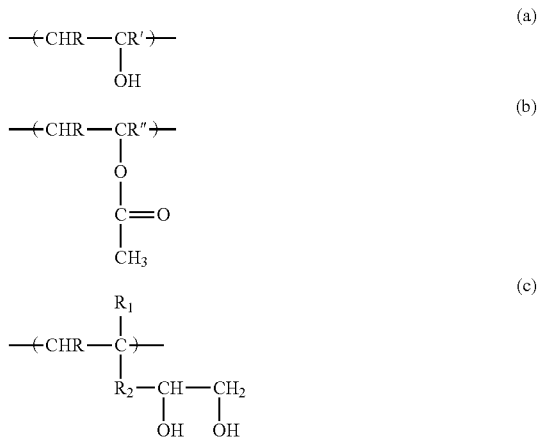

wherein R, R', and R" are independently hydrogen or a methyl group, $R_1$ is hydrogen or a methyl group, $R_2$ is a single connecting bond or a substituted or unsubstituted alkylene group having 1 to 3 carbon atoms, based on the total recurring units in the vinyl alcohol copolymer, wherein the (a) recurring units are present in an amount of at least 70 mol % and up to and including 98.9 mol %, the (b) recurring units are present in an amount of at least 0.1 mol % and up to and including 20 mol %, and the (c) recurring units are present in an amount of at least 1 mol % and up to and including 10 mol %, the vinyl alcohol copolymer is present in the outermost layer in an amount of at least 60 weight % and up to and including 100 weight %, based on the total outermost layer dry weight, and the outermost layer is present in a dry amount of at least 0.2 g/m² and up to and including 2.5 g/m².

This invention also provides a method for providing a lithographic printing plate, comprising:

imagewise exposing any embodiment negative-working lithographic printing plate of this invention to imaging radiation to provide exposed regions and non-exposed regions in the negative-working radiation-sensitive imageable layer, and removing the non-exposed regions from the negative-working radiation-sensitive imageable layer.

The present invention provides several advantages with the unique outermost layer (protective overcoat) used in the negative-working lithographic printing plate precursor of this invention. The vinyl alcohol copolymers used in this outermost layer allow for processing of imaged precursors without a separate step for washing off the outermost layer, and results in lithographic printing plates having high photospeed, and good latent image keeping because of the low oxygen permeability. In addition, the outermost layer exhibits good scratch resistance and adhesion to the underlying negative-working radiation-sensitive imageable layer.

Further advantages of the present invention would be apparent to one skilled in the art in view of the detailed description of the invention that is provided herein.

DETAILED DESCRIPTION OF THE INVENTION

Definitions

As used herein to define various components of the radiation-sensitive compositions, formulations, and layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

The term "imageable layer" is used herein to refer to the "negative-working radiation-sensitive imageable layer" used in the present invention.

Unless otherwise indicated, percentages refer to percents by dry weight of a composition or layer, or % solids of a solution.

As used herein, the term "radiation absorber" refers to compounds that are sensitive to certain wavelengths of radiation and can convert photons into heat or cause a chemical reaction within the layer in which they are disposed.

As used herein, the term "infrared" refers to radiation having a $\lambda_{max}$ of at least 700 nm and higher. In most instances, the term "infrared" is used to refer to the "near-infrared" region of the electromagnetic spectrum that is defined herein to be at least 700 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers that are derived from two or more different monomers, in any order along the polymer backbone. That is, they comprise recurring units having different chemical structures. The various recurring units can be in random order, or they can contain blocks of two or more of the same recurring unit. In the present invention, the vinyl alcohol copolymers have at least three different types of recurring units, as described below.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Negative-Working Lithographic Printing Plate Precursors

The lithographic printing plate precursors of this invention are designed to be negatively working so that they are imaged and processed to provide lithographic printing plates when the non-exposed regions of the imageable layer are removed and the imaged regions remain.

Substrates:

The lithographic printing plate precursors are formed by suitable application of an imageable layer formulation onto the substrate, which formulation is dried, and an outermost layer formulation is applied onto the imageable layer. The imageable layer formulation can also be generally considered to have the capability of absorbing near-UV, visible, or infrared radiation, for example containing a near-UV, visible, or infrared radiation absorber as described below. More details of these manufacturing steps are provided below along with description of the various layers.

The substrate can be treated or coated in various ways as described below prior to application of the imageable layer formulation. For example, the substrate can be treated to provide a subbing layer for improved adhesion or hydrophilicity, and the imageable layer formulation can be applied over this subbing layer.

The substrate generally has a hydrophilic surface, or a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metalized papers), or a lamination of any of these materials (such as a lamination of an aluminum foil onto a polyester film). Metal-containing supports include sheets or foils of aluminum, copper, zinc, titanium, and alloys thereof.

Polymeric film supports can be modified on one or both surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyltriethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

Useful substrates are aluminum-containing supports that can be coated or treated using techniques known in the art, including physical graining, electrochemical graining and chemical graining, followed by anodizing. The aluminum sheets are mechanically or electrochemically grained and anodized using phosphoric acid or sulfuric acid and conventional procedures.

In some embodiments, the surface of the aluminum-containing support can be electrochemically grained using the procedure and chemistry described in U.S. Patent Application Publication 2008/0003411 (Hunter et al.).

An optional interlayer can be formed on the grained and anodized aluminum-containing substrate by treating it with, for example, a silicate, dextrin, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution, or an alkali salt of a condensed aryl sulfonic acid as described in GB 2,098,627 and Japanese Kokai 57-195697A (both Herting et al.).

The thickness of the substrate can be varied but it should be sufficient to sustain the wear from printing and thin enough to wrap around a printing form.

The backside (non-imaging side) of the substrate can be coated with antistatic agents or slipping layer or matte layer to improve handling and "feel" of the imageable element. Furthermore, the backside of the lithographic printing plate precursor can be anodically oxidized to increase surface hardness and scratch resistance particularly when the substrate is composed of aluminum.

The substrate can also be a cylindrical surface having the layers applied thereon, and thus be an integral part of the printing press. The use of such imaged cylinders is described for example in U.S. Pat. No. 5,713,287 (Gelbart) that is incorporated herein by reference.

Negative-Working Radiation-Sensitive Imageable Layer:

Embodiments of this invention can be formed by suitable application of a negative-working radiation-sensitive composition as described below to a suitable substrate to form a negative-working radiation-sensitive imageable layer comprising a free radically polymerizable compound, a radiation absorber (such as a near-UV, visible, or infrared radiation absorber), and a compound to generate free radicals upon irradiation. There is generally only a single imageable layer comprising the negative-working radiation-sensitive composition and it is not the outermost layer in the element. An outermost topcoat (as described below) is present over the imageable layer.

Except for the unique features of the present invention, details of negative-working lithographic printing plate precursors useful in the present invention are described for example, in EP Patent Publications 924,570A1 (Fujimaki et al.), 1,063,103A1 (Uesugi), and EP 1,449,650A1 (Goto), and U.S. Pat. No. 4,511,645 (Koike et al.), U.S. Pat. No. 6,027,857 (Li et al.), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), and U.S. Pat. No. 7,615,323 (Shrehmel et al.), and U.S. Patent Application Publications 2003/0064318 (Huang et al.), 2004/0265736 (Aoshima et al.), and 2005/0266349 (Van Damme et al.) all of which are incorporated herein by reference. Other useful negative-working compositions and elements are described for example in U.S. Pat. No. 6,232,038 (Takasaki) and U.S. Pat. No. 6,514,657 (Sakurai et al.) and U.S. Patent Publication 2009/0092923 (Hayashi), all of which are incorporated herein by reference.

The radiation-sensitive compositions and imageable layers used in the present invention generally include one or more polymeric binders that facilitate the developability of the imaged precursors. Such polymeric binders include but are not limited to, those that are not generally crosslinkable and are usually film-forming in nature (dissolvable in coating solvent) but other polymeric binders can be present at least partially as discrete particles (not-agglomerated). Such polymers can be present as discrete particles having an average particle size of at least 10 nm and up to and including 500 nm, and typically at least 100 nm and up to and including 450 nm, and that are generally distributed uniformly within that layer. The particulate polymeric binders exist at room temperature as discrete particles, for example in an aqueous dispersion. Such polymeric binders generally have a molecular weight ($M_n$) of at least 5,000 and typically at least 20,000 and up to and including 100,000, or at least 30,000 and up to and including 80,000, as determined by Gel Permeation Chromatography.

For negative-working lithographic printing plate precursors that are designed for on-press development, useful particulate polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.), and US Patent Application Publication 2005/0003285 (Hayashi et al.), all of which are incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 and up to and including 500,000, or at least 100,000 and up to and including 300,000, as determined by dynamic light scattering.

Additional useful polymeric binders are particulate poly (urethane-acrylic) hybrids that are distributed (usually uniformly) throughout the imageable layer. Each of these hybrids has a molecular weight of at least 50,000 and up to and including 500,000 and the particles have an average particle size of at least 10 nm and up to and including 10,000 nm (typically at least 30 nm and up to and including 500 nm or at least 30 and up to and including 150 nm). These hybrids can be either "aromatic" or "aliphatic" in nature depending upon the specific reactants used in their manufacture. Some poly (urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, antifoaming agents, dispersing agents, anti-corrosive agents, and optionally pigments and water-miscible organic solvents.

These polymeric binders are generally present in an amount of at least 5 weight % and up to and including 70 weight % of the radiation-sensitive composition.

Other useful polymeric binders can be homogenous, that is, film-forming, non-particulate, or dissolvable in the coating solvent. Such polymeric binders include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.), all of which are incorporated herein by reference. Also useful are the vinyl carbazole polymers described in U.S. Pat. No. 7,175,949 (Tao et al.), and the polymers having pendant vinyl groups as described in U.S. Pat. No. 7,279,255 (Tao et al.), both patents being incorporated herein by reference. Useful are random copolymers derived from polyethylene glycol methacrylate/acrylonitrile/styrene monomers in random fashion and in particulate form, dissolved random copolymers derived from carboxyphenyl methacrylamide/acrylonitrile/-methacrylamide/N-phenyl maleimide, random copolymers derived from polyethylene glycol methacrylate/acrylonitrile/vinyl carbazole/styrene/-methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxyethyl methacrylate)/acrylonitrile/N-phenyl maleimide, and random copolymers derived from N-methoxymethyl methacrylamide/methacrylic acid/acrylonitrile/n-phenylmaleimide. By "random" copolymers, we mean the conventional use of the term, that is, the structural units in the polymer backbone that are derived from the monomers are arranged in random order as opposed to being block copolymers.

The useful polymeric binders can be selected from any alkaline solution soluble (or dispersible) polymer having an acid value of at least 20 and up to and including 400 (typically at least 30 and up to and including 200). The following described polymeric binders are particularly useful in the manner but this is not an exhaustive list:

I. Film-forming polymers formed by polymerization of a combination or mixture of (a) (meth)acrylonitrile, (b) poly (alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth) acrylic acids, (meth)acrylate esters, styrene and its derivatives, vinyl carbazoles, and poly(alkylene oxide) (meth)acrylates.

II. Film-forming polymers having pendant allyl ester groups as described in U.S. Pat. No. 7,332,253 (Tao et al.) that is incorporated herein by reference. Such polymers can also include pendant cyano groups or have recurring units derived from a variety of other monomers as described in Col. 8, line 31 to Col. 10, line 3 of the noted patent.

III. Film-forming polymers having all carbon backbones wherein at least 40 and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms. Useful polymeric binders of this type are described for example in U.S. Patent Application Publication 2008-0280229 (Tao et al.) that is incorporated herein by reference.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Film-forming, polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

V. Film-forming polymeric binders can have pendant 1H-tetrazole groups as described in U.S. Patent Application Publication 2009-0142695 (Baumann et al.) that is incorporated herein by reference.

VI. Still other useful polymeric binders can be film-forming or exist as discrete particles and include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.) all of which are incorporated herein by reference. Also useful are the vinyl carbazole polymers described in U.S. Pat. No. 7,175,949 (Tao et al.) that is incorporated herein by reference.

Other useful polymeric binders are particulate poly(urethane-acrylic) hybrids that are distributed (usually uniformly) throughout the imageable layer. Each of these hybrids has a molecular weight of at least 50,000 and up to and including 500,000 and the particles have an average particle size of at least 10 nm and up to and including 10,000 nm (typically at least 30 nm and up to and including 500 nm).

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or pre-polymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable compounds include urea urethane (meth)acrylates or urethane (meth)acrylates having multiple polymerizable groups. For example, a free radically polymerizable component can be prepared by reacting DES-MODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) all incorporated herein by reference. Other useful free radically polymerizable components include those described in U.S. Patent Application Publication 2009/0142695 (Baumann et al.), which radically polymerizable components include 1H-tetrazole groups.

In addition to, or in place of the free radically polymerizable components described above, the radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There can be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

This radiation-sensitive composition also includes an initiator composition that includes one or more compounds that are capable of generating free radicals sufficient to initiate polymerization of all the various free radically polymerizable components upon exposure (irradiation) of the composition to imaging radiation. The initiator composition is generally responsive, for example, to electromagnetic radiation in the infrared spectral regions, corresponding to the broad spectral range of at least 700 nm and up to and including 1500 nm, and typically radiation of at least 700 nm and up to and including 1400 nm. Alternatively, the initiator composition can be responsive to exposing radiation in the violet region and visible region of at least 300 nm and up to and including 700 nm and typically at least 300 nm and up to and including 450 nm for the violet region.

More typically, the initiator composition includes one or more an electron acceptors and one or more co-initiators that are capable of donating electrons, hydrogen atoms, or a hydrocarbon radical.

In general, suitable initiator compositions for radiation-sensitive compositions comprise compounds that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al. that is incorporated herein), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.) that is incorporated herein by reference, and onium salts (such as ammonium salts, diaryliodonium salts, triarylsulfonium salts, aryldiazonium salts, and N-alkoxypyridinium salts).

Hexaarylbiimidazoles, onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles are also described in U.S. Pat. No. 4,565,769 (Dueber et al.) and U.S. Pat. No. 3,445,232 (Shirey) and can be prepared according to known methods, such as the oxidative dimerization of triarylimidazoles.

Useful initiator compositions for infrared (IR) radiation-sensitive compositions include onium compounds including ammonium, sulfonium, iodonium, and phosphonium compounds, particularly in combination with cyanine infrared radiation-sensitive dyes. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl) phenyl]-moiety and a suitable negatively charged counterion.

The iodonium cations can be supplied as part of one or more iodonium salts, such as iodonium borates. For example, the iodonium cations and boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

Useful IR radiation-sensitive initiator compositions can comprise one or more diaryliodonium borate compounds. Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The imageable layers can comprise a radiation-sensitive imaging composition that includes one or more infrared radiation absorbers or one or more UV sensitizers that are sensitive at imaging radiation of at least 150 nm to and including 1500 nm. The total amount of one or more infrared radiation absorbers or UV sensitizers is at least 1 weight % and up to and including 30 weight %, or typically at least 5 weight % and up to and including 20 weight %, based on the imageable layer total solids.

In some embodiments, the radiation-sensitive composition contains a sensitizer where the free-radical generating compound is UV or violet radiation sensitive (that is at least 150 nm and up to and including 475 nm), thereby facilitating photopolymerization. In some other embodiments, the radiation sensitive compositions are sensitized to "violet" radiation in the range of at least 300 nm and up to and including 475 nm. Useful sensitizers for such compositions include certain pyrylium and thiopyrylium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describes useful bisoxazole derivatives and analogues, and U.S. Patent Application Publications 2006/0063101 and 2006/0234155 (both Baumann et al.), all of which are incorporated herein by reference.

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-visible radiation sensitizers are the compounds described in WO 2004/074929 (Baumann et al.) that is incorporated herein by reference. These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted Baumann et al. publication.

Other useful sensitizers for the violet region of sensitization are the 2,4,5-triaryloxazole derivatives as described in WO 2004/074930 (Baumann et al.) that is incorporated herein by reference. These compounds can be used alone or with a co-initiator as described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan or oxazole ring, or the Structure G-$(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —N($R'_4$)($R'_5$) group, or a —O$R'_6$ group wherein $R'_4$ through $R'_6$ independently represent substituted or unsubstituted alkyl or aryl groups as defined above. At least one of $R'_1$ through $R'_3$ is an —N($R'_4$)($R'_5$) group wherein $R'_4$ and $R'_5$ are the same or different alkyl groups. Useful substituents for each $Ar_1$ group include the same or different primary, secondary, and tertiary amines.

Still another class of useful violet radiation sensitizers includes compounds represented by the Structure $Ar_t$-G-$Ar_2$ wherein $Ar_t$ and $Ar_e$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. An is the same as defined above, and $Ar_2$ can be the same or different aryl group as $Ar_1$. "Arylene" can be any of the aryl groups defined for $Ar_1$ but with a hydrogen atom removed to render them divalent in nature.

Some useful infrared radiation absorbers are sensitive to both infrared radiation (typically of at least 700 nm and up to and including 1400 nm) and visible radiation (typically of at least 450 nm and up to and including 700 nm). These compounds can also have a tetraaryl pentadiene chromophore. Such chromophore generally includes a pentadiene linking group having 5 carbon atoms in the chain, to which are attached two substituted or unsubstituted aryl groups at each end of the linking group. Other details of such compounds are provided in U.S. Pat. No. 7,429,445 (Munnelly et al.) that is incorporated herein by reference.

Other useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above) all of which are incorporated herein by reference. Infrared radiation absorbing N-alkylsulfate cyanine dyes are described for example in U.S. Pat. No. 7,018,775 (Tao) that is incorporated herein by reference. A general description of one class of suitable cyanine dyes is shown by the formula in paragraph [0026] of WO 2004/101280 (Munnelly et al.) that is also incorporated herein by reference.

In addition to low molecular weight IR-absorbing dyes having IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.) all of which are incorporated herein by reference. Suitable dyes can be formed using conventional methods and starting materials or obtained from various commercial sources including American Dye Source (Baie D'Urfe, Quebec, Canada) and FEW Chemicals (Germany).

Useful IR-radiation sensitive compositions are also described, for example, in U.S. Pat. No. 7,452,638 (Yu et al.), and U.S. Patent Application Publications 2008/0254387 (Yu et al.), 2008/0311520 (Yu et al.), 2009/0263746 (Ray et al.), and 2010/0021844 (Yu et al.) all of which are incorporated herein by reference.

The imageable layer can also include a poly(alkylene glycol) or an ether or ester thereof that has a molecular weight of at least 200 and up to and including 4000, poly(vinyl alcohol), poly(vinyl pyrrolidone), poly(vinyl imidazole), or polyester in an amount of up to and including 20 weight % based on the total dry weight of the imageable layer.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Irmo et al.). The imageable layer can also include a variety of other optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The imageable layer also optionally includes a phosphate (meth)acrylate having a molecular weight generally greater than 250 as described in U.S. Pat. No. 7,429,445 (Munnelly et al.) that is incorporated herein by reference.

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The radiation-sensitive composition can also be applied by spraying onto a suitable support (such as an on-press printing cylinder). Typically, the radiation-sensitive composition is applied as a formulation containing all of the desired components and dried to form an imageable layer.

Outermost Layer:

The precursor of this invention comprises an outermost layer disposed over the imageable layer. In most embodiments, the outermost layer is disposed directly on the negative-working radiation-sensitive imageable layer, but one or more intermediate layers can be present if desired.

By "outermost", it is meant that there are no layers disposed over it and it is the first layer in the precursor that is impacted by irradiation. This outermost layer is sometimes identified in the art as an "overcoat", "oxygen impermeable topcoat", or "oxygen barrier layer" disposed over the negative-working imageable layer.

The outermost layer used in the practice of this invention comprises one or more vinyl alcohol copolymers. Each vinyl alcohol copolymer comprises at least one unit of each of the following (a), (b), and (c) recurring units, in any order:

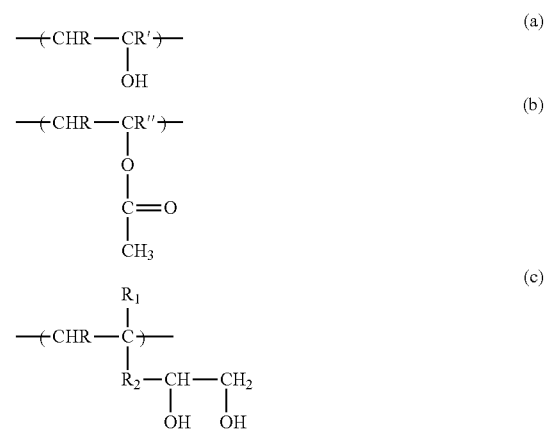

In these recurring units structures, R, R', and R" are independently hydrogen or a substituted or unsubstituted alkyl group having 1 to 4 carbon atoms, such as substituted or unsubstituted methyl, ethyl, n-propyl, iso-propyl, n-butyl, and t-butyl. R, R', and R' are particularly useful as hydrogen or substituted or unsubstituted methyl, and particularly each can be hydrogen or unsubstituted methyl. In still other embodiments, each of R, R', and R" is hydrogen.

In addition, $R_1$ is hydrogen or a substituted or unsubstituted alkyl group having 1 to 4 carbon atoms, such as substituted or unsubstituted methyl, ethyl, n-propyl, iso-propyl, n-butyl, and t-butyl. $R_1$ is particularly useful as hydrogen or substituted or unsubstituted methyl, and particularly it can be hydrogen or unsubstituted methyl. In still other embodiments, $R_1$ is hydrogen.

$R_2$ represents a single connecting bond or a substituted or unsubstituted alkylene or cycloalkylene group. These alkylene groups can have 1 to 4 carbon atoms and can be linear or branched, and the cycloalkylene groups can have 5 to 7 carbon atoms in the unsaturated carbocyclic ring. In some embodiments, $R_2$ is a single connecting bond or a substituted or unsubstituted alkylene group having 1 to 3 carbon atoms, and in particularly useful embodiments, $R_2$ is a single connecting bond or an unsubstituted methylene or ethylene, or more likely a single connecting bond or an unsubstituted methylene.

In the vinyl alcohol copolymers, the (c) recurring units are present in an amount of at least 0.5 mol %, and typically at least 0.5 mol % and up to and including 20 mol %, or more particularly at least 1 mol % and up to and including 10 mol %, all based on the total recurring units in the vinyl alcohol copolymer.

In many embodiments of the vinyl alcohol copolymers, the (a) recurring units are present in an amount of at least 40 mol % and up to and including 99.4 mol %, the (b) recurring units are present in an amount of at least 0.1 mol % and up to and including 40 mol %, and the (c) recurring units are present in an amount of at least 0.5 mol % and up to and including 20 mol %, based on the total recurring units in the vinyl alcohol copolymer.

More particularly, the vinyl alcohol copolymers comprise the (a) recurring units in an amount of at least 70 mol % and up to and including 98.8 mol %, the (b) recurring units in an amount of at least 0.1 mol % and up to and including 20 mol %, and the (c) recurring units in an amount of at least 1 mol % and up to and including 10 mol %, based on the total recurring units in the vinyl alcohol copolymer.

In some embodiments, the outermost layer can comprise two or more of the described vinyl alcohol copolymers. A first vinyl alcohol copolymer comprises at least one of each of the (a), (b), and (c) recurring units, respectively, in any order, as described above. A second vinyl alcohol copolymer can also comprise at least one of the (a), (b), and (c) recurring units, respectively, in any order, and the ratio of the (b) recurring units in the first vinyl alcohol copolymer to the (b) recurring units in the second vinyl alcohol copolymer is at least 1.1:1, or even at least 1.05:1. In such mixtures, the (a), (b), and (c) recurring units in the various vinyl alcohol copolymers can be the same or different in composition as long as the recurring units fall within the noted structures shown above. In addition, the various recurring units in the multiple vinyl alcohol copolymers can be arranged in the same or different order along the polymer backbone.

The vinyl alcohol copolymer is generally present in the outermost layer in an amount of at least 40 weight % and up to and including 100 weight %, or typically at least 60 weight % and up to and including 100 weight %, based on the total outermost layer dry weight.

In the negative-working lithographic printing plate precursors, the outermost layer is generally present in a dry amount of at least 0.1 $g/m^2$ and up to and including 4 $g/m^2$, or typically in a dry amount of at least 0.2 $g/m^2$ and up to and including 2.5 $g/m^2$.

The outermost layer can optionally comprise one or more water-soluble poly(vinyl alcohol)s that are different than the vinyl alcohol copolymers described above, each having a saponification degree of at least 90%, in an amount of up to 99.5 weight %, based on the total dry weight of the outermost layer.

Moreover, the outermost layer can optionally further comprise another water-soluble polymer that is not a poly(vinyl alcohol) in an amount of at least 0.5 weight % and up to and including 40 weight %, such as a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, and vinyl imidazole, and vinyl acetamide.

The outermost layer formulation can also include cationic, anionic, and non-ionic wetting agents or surfactants, flow improvers or thickeners, antifoamants, colorants, particles such as aluminum oxide, inorganic stratified compounds as described in EP 1,640,805A1 (Takanori et al.), silicon dioxide, organic particles such as wax particles, crosslinked organic particles or crosslinked organic particles as described in EP 1,495,864 (Oshima et al.), and biocides. The size of the particles in the outermost layer can range from at least 0.005 µm to and including 20 µm, with a combination of types and sizes possible. Details about such addenda are provided in WO 99/06890 (Pappas et al.) that is incorporated by reference. Furthermore, the outermost layer formulation can also include dyes having absorption peaks in the spectral range of from 350 nm to and including 1200 nm, as described in EP 2,173,827 (Nguyen et al.). Such dyes can act as filter dyes to improve light safety during handling or to improve image sharpness, or they can also work as colorants to improve control during manufacturing or handling.

Preparation of Precursors:

Illustrative of methods for making the precursors of this invention, includes mixing the various components needed for a specific imaging chemistry for an imageable layer in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a suitable substrate, and removing the solvent(s) by evaporation under suitable drying conditions. Some representative coating solvents and imageable layer formulations are described in the Invention Examples below. After proper drying, the coating weight of the imageable layer is generally at least 0.1 $g/m^2$ and up to and including 5 $g/m^2$ or at least 0.5 $g/m^2$ and up to and including 3.5 $g/m^2$.

Layers can also be present under the imageable layer to enhance developability or to act as a thermal insulating layer.

As noted above, the outermost layer formulation can be disposed over or applied to the imageable layer (usually in dried form), and dried in a suitable manner to provide the desired outermost layer coating weight.

Once the various layers have been applied and dried on the substrate, the negative-working lithographic printing plate precursors (alone or in stacks) can be enclosed in water-impermeable material that substantially inhibits the transfer of moisture to and from the element and "heat conditioned" as described in U.S. Pat. No. 7,175,969 (noted above) that is incorporated herein by reference.

The lithographic printing plate precursors can be stored and transported as stacks of precursors within suitable packaging, containers, and interleaf sheets known in the art.

Imaging Conditions

During use, the lithographic printing plate precursor is exposed to a suitable source of exposing radiation depending upon the radiation absorber present in the radiation-sensitive composition to provide specific sensitivity that is at a wavelength of at least 150 nm and up to and including 1500 nm. In some embodiments, imagewise exposure is carried out using radiation the range of at least 150 nm and up to and including 475 nm, or in the range of at least 750 nm and up to and including 1500 nm, or up to and including 1400 nm.

For example, imaging can be carried out using imaging or exposing radiation from an infrared radiation-generating laser (or array of such lasers). Imaging also can be carried out using imaging radiation at multiple wavelengths at the same time if desired. The laser used to expose the lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 $mJ/cm^2$ and up to and including 500 $mJ/cm^2$, and typically at least 50 $mJ/cm^2$ and up to and including 300 $mJ/cm^2$ depending upon the sensitivity of the imageable layer. With these platesetters, any imaging parameters such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using such as stepwise imaged lithographic printing plate precursor, a shortened printing run is possible and the obtained prints are also useful for determining such imaging parameters.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 150 nm and up to and including 475 nm), can be carried out generally using energies of at least 0.01 $mJ/cm^2$ and up to and including 0.5 $mJ/cm^2$, and typically at least 0.02 $mJ/cm^2$ and up to and including about 0.1 $mJ/cm^2$. It would be desirable, for example, to image the UV/visible radiation-sensitive imageable elements at a power density in the range of at least 0.5 $kW/cm^2$ and up to and including 50 $kW/cm^2$ and typically of at least 5 $kW/cm^2$ and up to and including 30 $kW/cm^2$, depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

After imaging, the imaged negative-working lithographic printing plate precursors can be processed "off-press" using a suitable processing solution described herein, for example using water or a processing solution having a pH of at least 5 and up to and including 14 (or even at least pH 5 and up to and including pH 13), or more likely an alkaline processing solution having a pH greater than 7 and up to and including 13.5. Such processing is carried out with imaged negative-working precursors for a time sufficient to remove the non-exposed regions of the imaged imageable layer to reveal the hydrophilic surface of the substrate, but not long enough to remove significant amounts of the exposed regions that have been hardened. The revealed hydrophilic substrate surface repels inks while the exposed regions accept ink. Thus, the non-exposed regions to be removed are "soluble" or "removable" in the processing solution because they are removed, dissolved, or dispersed within it more readily than the exposed regions that are to remain. The term "soluble" also means "dispersible".

Development off-press can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a suitable processing solution (described below), and followed by rinsing with water. "Dip" development involves dipping the imaged precursor in a tank or tray containing the appropriate processing solution for at least 10 seconds and up to and including 60 seconds (especially at least 20 seconds and up to and including 40 seconds) under agitation, followed by rinsing with water with or without rubbing with a sponge or cotton pad. The use of automatic development apparatus is well known and generally includes pumping a processing solution into a developing tank or ejecting it from spray nozzles. The imaged precursor is contacted with the processing solution in an appropriate manner. The apparatus can also include a suitable rubbing mechanism (for example a brush or roller) and a suitable number of conveyance rollers. Some developing apparatus include laser exposure means and the apparatus is divided into an imaging section and a developing section.

Both aqueous alkaline developers and organic solvent-containing developers or processing solutions can be used. Some useful processing solutions are described for example, in U.S. Pat. No. 7,507,526 (Miller et al.) and U.S. Pat. No. 7,316,894 (Miller et al.). Processing solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates).

Useful alkaline developer solutions include 1080 Developer, 1090 Developer, SP200 Developer, SP200D Developer, SP200AA Developer, SP500 Developer, 206 Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, phosphates, carbonates, amines, and bicarbonates).

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5% and up to 15% based on total developer weight. The organic solvent-containing developers can be neutral, alkaline, or slightly acidic in pH, and typically, they are alkaline in pH. Representative organic solvent-containing developers include ND-1 Developer, Developer 980, Developer 1080, 1090 Developer, SP200 Developer, SP200D Developer, SP200AA Developer, SP500 Developer, 206 Developer, 2 in 1 Developer, 955 Developer, D29 Developer (described below), and 956 Developer (all available from Eastman Kodak Company).

The processing solution (or developer) can be applied to the imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator. For example, the imaged precursor can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). As noted above, the imaged precursor can be immersed in the processing solution and rubbed by hand or with an apparatus. To assist in the removal of the back side coating, a brush roller or other mechanical component can be placed in contact with the back side coating during processing. Alternatively, the processing solution can be sprayed using a spray bar using a sufficient force.

The processing solution can also be applied in a processing unit (or station) in a suitable apparatus that has at least one roller for rubbing or brushing the imaged precursor while the processing solution is applied. Residual processing solution can be removed (for example, using a squeegee or nip rollers) or left on the resulting lithographic printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

After the development step, a water rinse that can be supported by brush treatment, followed by a "gumming" step including application of a water-soluble protective layer, can be included in the processing method. Processing equipment used for processing imaged lithographic printing plates usually includes these treatments and a thermal drying step as well.

Following off-press development, the resulting lithographic printing plate can be postbaked with or without blanket or floodwise exposure to UV or visible radiation. Alternatively, a blanket UV or visible radiation exposure can be carried out, without a postbake operation.

In some embodiments, an aqueous processing solution (for example developer) can be used off-press to both develop the imaged precursor by removing predominantly the non-exposed regions and also to provide a protective layer or coating over the entire imaged and developed surface of the lithographic printing plate. In this aspect, the aqueous alkaline solution behaves somewhat like a gum that is capable of protecting (or "gumming") the lithographic image on the printing plate against contamination or damage (for example, from oxidation, fingerprints, dust, or scratches). The aqueous alkaline solution can include an organic amine having a boiling point of less than 300° C. (and typically of at least) 50°, a film-forming hydrophilic polymer, and optionally an anionic or nonionic surfactant. The pH of the aqueous alkaline solution can be adjusted by adding a suitable amount of an alkaline component such as alkali silicates (including metasilicates), alkali metal hydroxides (such as sodium hydroxide and potassium hydroxide), and quaternary ammonium hydroxides. Tap water can be used to make up such a solution and generally provides at least 45 weight % and up to and including 98 weight % of the processing solution.

Useful organic amines are relatively volatile organic primary, secondary, and tertiary amines that include but are not limited to, alkanolamines (including cycloalkyl amines), carbocyclic aromatic amines, and heterocyclic amines, that are present in a total amount of at least 0.1 weight % and generally up to and including 50 weight %. Useful amines are mono-, di- and trialkanol amines such as monoethanolamine, diethanolamine, triethanolamine, and mono-n-propanolamine, or combinations of these compounds.

One or more film-forming water-soluble or hydrophilic polymers can be present in the aqueous alkaline solution in an amount of at least 0.25 weight % and up to 30 weight % and typically at least 1 weight % and up to and including 15 weight %. Examples of useful polymers of this type include but are not limited to, gum arabic, pullulan, cellulose derivatives (such as hydroxymethyl celluloses, carboxymethylcelluloses, carboxyethylcelluloses, and methyl celluloses), starch derivatives [such as (cyclo)dextrins, starch esters, dextrins, carboxymethyl starch, and acetylated starch]poly(vinyl alcohol), poly(vinyl pyrrolidone), polyhydroxy compounds [such as polysaccharides, sugar alcohols such as sorbitol, miso-inosit, homo- and copolymers of (meth)acrylic acid or (meth)acrylamide], copolymers of vinyl methyl ether and maleic anhydride, copolymers of vinyl acetate and maleic anhydride, copolymers of styrene and maleic anhydride, and copolymers having recurring units with carboxy, sulfo, or phospho groups, or salts thereof. Useful hydrophilic polymers include gum arabic, (cyclo)dextrin, a polysaccharide, a sugar alcohol, or a homo- or copolymer having recurring units derived from (meth)acrylic acid.

The aqueous alkaline solution optionally includes one or more anionic, amphoteric, or nonionic surfactants (or both) in an amount of at least 0.25 weight % and up to and including 50 weight %, and typically at least 0.25 weight % and up to and including 30 weight %.

Additional optional components of the aqueous alkaline solutions used in this invention include antifoaming agents, buffers, biocides, complexing agents, and small amounts of water-miscible organic solvents such as reaction products of phenol with ethylene oxide and propylene oxide, benzyl alcohol, esters of ethylene glycol and propylene glycol with acids having 6 or less carbon atoms, sludge inhibitors (such as filter dyes and free-radical inhibitors), odorants, anti-corrosion agents, and dyes.

The resulting lithographic printing plate can also be baked in a postbake operation that can be carried out, with or without a blanket or floodwise exposure to UV or visible radiation using known conditions. Alternatively, a blanket UV or visible radiation exposure can be carried out, without a postbake operation.

Printing can be carried out by putting the imaged and developed lithographic printing plate on a suitable printing press. The lithographic printing plate is generally secured in the printing plate using suitable clamps or other holding devices. Once the lithographic printing plate is secured in the printing press, printing is carried out by applying a lithographic printing ink and fountain solution to the printing surface of the lithographic printing plate. The fountain solution is taken up by the surface of the hydrophilic substrate revealed by the imaging and processing steps, and the ink is taken up by the remaining regions of the imageable layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material (for example, sheets of paper). The lithographic printing plates can be cleaned between impressions, if desired, using conventional cleaning means.

For imaged negative-working lithographic printing plate precursors that are designed for on-press development, the imaged lithographic printing plate precursor is mounted on press wherein the non-exposed regions in the imageable layer are removed (developed) using a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the substrate revealed by the imaging and development steps, and ink is taken up by the imaged (exposed) regions of the imageable layer. The ink is then transferred to a suitable receiving material (such as cloth, paper, metal, glass, or plastic) to provide a desired impression of the image thereon. If desired, an intermediate "blanket" roller can be used to transfer the ink from the imaged precursor to the receiving material. The imaged precursors can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A negative-working lithographic printing plate precursor comprising a substrate, and comprising on the substrate:

a negative-working radiation-sensitive imageable layer comprising a free radically polymerizable compound, a radiation absorber, a compound to generate free radicals upon irradiation, and a polymeric binder, and disposed over the negative-working radiation-sensitive imageable layer, an outermost layer comprising a vinyl alcohol copolymer comprising at least one unit of each of the following (a), (b), and (c) recurring units, in any order:

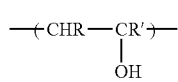

(a)

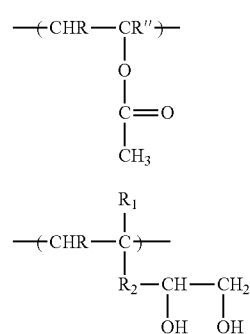

wherein R, R', and R" are independently hydrogen or a substituted or unsubstituted alkyl group having 1 to 4 carbon atoms, $R_1$ is hydrogen or a substituted or unsubstituted alkyl group having 1 to 4 carbon atoms, $R_2$ represents a single connecting bond or a substituted or unsubstituted alkylene or cycloalkylene group, wherein the (c) recurring units are present in an amount of at least 0.5 mol %, based on the total recurring units in the vinyl alcohol copolymer.

2. The negative-working lithographic printing plate precursor of embodiment 1, wherein R, R', and R" are independently hydrogen or a methyl group, $R_1$ is hydrogen or a methyl group, and $R_2$ is a single connecting bond or a substituted or unsubstituted alkylene group having 1 to 3 carbon atoms.

3. The negative-working lithographic printing plate precursor of embodiment 1 or 2, wherein the (a) recurring units are present in an amount of at least 40 mol % and up to and including 99.4 mol %, the (b) recurring units are present in an amount of at least 0.1 mol % and up to and including 40 mol %, and the (c) recurring units are present in an amount of at least 0.5 mol % and up to and including 20 mol %, based on the total recurring units in the vinyl alcohol copolymer.

4. The negative-working lithographic printing plate precursor of any of embodiments 1 to 3, wherein the (a) recurring units are present in an amount of at least 70 mol % and up to and including 98.8 mol %, the (b) recurring units are present in an amount of at least 0.1 mol % and up to and including 20 mol %, and the (c) recurring units are present in an amount of at least 1 mol % and up to and including 10 mol %, based on the total recurring units in the vinyl alcohol copolymer.

5. The negative-working lithographic printing plate precursor of any of embodiments 1 to 4, wherein R, R', R", and $R_1$ are each hydrogen, and $R_2$ is a single connecting bond or methylene.

6. The negative-working lithographic printing plate precursor of any of embodiments 1 to 5, wherein the vinyl alcohol copolymer is present in the outermost layer in an amount of at least 40 weight % and up to and including 100 weight %, based on the total outermost layer dry weight.

7. The negative-working lithographic printing plate precursor of any of embodiments 1 to 6, wherein the outermost layer is disposed directly on the negative-working radiation-sensitive imageable layer.

8. The negative-working lithographic printing plate precursor of any of embodiments 1 to 7, wherein the outermost layer is present in a dry amount of at least 0.1 $g/m^2$ and up to and including 4 $g/m^2$.

9. The negative-working lithographic printing plate precursor of any of embodiments 1 to 8, wherein the radiation absorber is sensitive at a peak wavelength of at least 150 nm to and including 1500 nm.

10. The negative-working lithographic printing plate precursor of any of embodiments 1 to 9, wherein the outermost layer comprises: (1) a first vinyl alcohol copolymer comprising at least one of each of the (a), (b), and (c) recurring units, respectively, in any order, and (2) a second vinyl alcohol copolymer comprising at least one of the (a), (b), and (c) recurring units, respectively, in any order, wherein the ratio of the (b) recurring units in the first vinyl alcohol copolymer to the (b) recurring units in the second vinyl alcohol copolymer is at least 1.1:1.

11. A negative-working lithographic printing plate precursor comprising a grained and anodized aluminum-containing substrate, and comprising on the substrate:

a single negative-working radiation-sensitive imageable layer comprising a free radically polymerizable compound, an infrared radiation absorber, an onium compound to generate free radicals upon irradiation, and a polymeric binder, and disposed directly on the negative-working radiation-sensitive imageable layer, an outermost layer comprising a vinyl alcohol copolymer comprising at least one unit of each of the following (a), (b), and (c) recurring units, in any order:

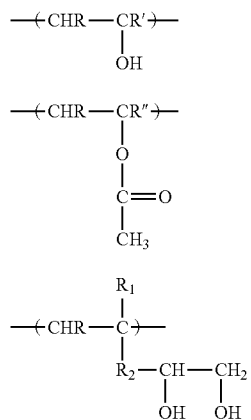

wherein R, R', and R" are independently hydrogen or a methyl group, $R_1$ is hydrogen or a methyl group, $R_2$ is a single connecting bond or a substituted or unsubstituted alkylene group having 1 to 3 carbon atoms, based on the total recurring units in the vinyl alcohol copolymer, wherein the (a) recurring units are present in an amount of at least 70 mol % and up to and including 98.8 mol %, the (b) recurring units are present in an amount of at least 0.1 mol % and up to and including 20 mol %, and the (c) recurring units are present in an amount of at least 1 mol % and up to and including 10 mol %, the vinyl alcohol copolymer is present in the outermost layer in an amount of at least 60 weight % and up to and including 100 weight %, based on the total outermost layer dry weight, and the outermost layer is present in a dry amount of at least 0.2 g/m² and up to and including 2.5 g/m².

12. A negative-working lithographic printing plate precursor comprising a grained and anodized aluminum-containing substrate, and comprising on the substrate:

a single negative-working radiation-sensitive imageable layer comprising a free radically polymerizable compound, a sensitizer for imaging radiation of at least 350 nm to and including 450 nm, a compound to generate free radicals upon irradiation to imaging radiation of at least 350 nm to and including 450 nm, and a polymeric binder, and disposed directly on the negative-working radiation-sensitive imageable layer, an outermost layer comprising a vinyl alcohol copolymer comprising at least one unit of each of the following (a), (b), and (c) recurring units, in any order:

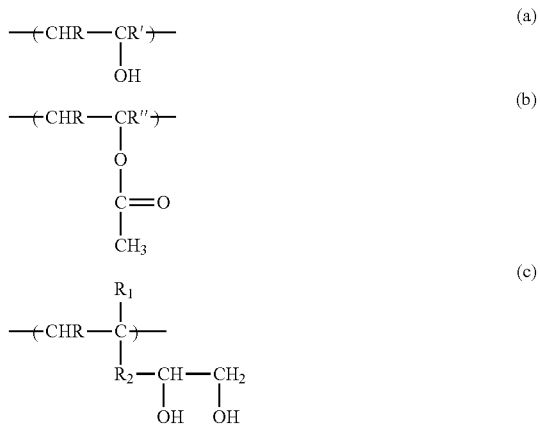

wherein R, R', and R" are independently hydrogen or a methyl group, $R_1$ is hydrogen or a methyl group, $R_2$ is a single connecting bond or a substituted or unsubstituted alkylene group having 1 to 3 carbon atoms, based on the total recurring units in the vinyl alcohol copolymer, wherein the (a) recurring units are present in an amount of at least 70 mol % and up to and including 98.8 mol %, the (b) recurring units are present in an amount of at least 0.1 mol % and up to and including 20 mol %, and the (c) recurring units are present in an amount of at least 1 mol % and up to and including 10 mol %, the vinyl alcohol copolymer is present in the outermost layer in an amount of at least 60 weight % and up to and including 100 weight %, based on the total outermost layer dry weight, and the outermost layer is present in a dry amount of at least 0.2 g/m² and up to and including 2.5 g/m².

13. A method for providing a lithographic printing plate, comprising:

imagewise exposing the negative-working lithographic printing plate of any of embodiments 1 to 12 to imaging radiation to provide exposed regions and non-exposed regions in the negative-working radiation-sensitive imageable layer, and removing the non-exposed regions from the negative-working radiation-sensitive imageable layer.

14. The method of embodiment 13, wherein imagewise exposing is carried out using imaging radiation at a wavelength of either from 150 nm to and including 475 nm, or from 750 nm to and including 1500 nm.

15. The method of embodiment 13 or 14, wherein removing the non-exposed regions is carried out off-press using an aqueous solution having a pH of at least 5 to and including 13.

16. The method of any of embodiments 13 to 15, wherein removing the non-exposed regions is carried out off-press using an aqueous solution that also provides a protective coating on the lithographic printing plate.

17. The method of any of embodiments 13 to 16, wherein the lithographic printing plate is used for lithographic printing without further treatment with a solution off-press.

18. The method of any of embodiments 13 or 14, wherein removing the non-exposed regions is carried out on-press using a lithographic printing ink, fountain solution, or both.

The following Examples are provided to illustrate the practice of this invention and are not meant to be limiting in any manner.

The following components were used in preparing the imageable elements used in the examples:

| | |
|---|---|
| Aerodisp ® 1030 | 30% Dispersion of surface modified silica particles in methoxypropylacetate from EVONIK, Germany |
| Binder 1 | Copolymer derived from 20 mol % of methacrylic acid, 40 mol % of allyl methacrylate, 20 mol % of benzyl methacrylate, and 20 mol % of N-isopropyl methacrylamide |
| Binder 2 | Copolymer derived from 20 mol % of methacrylic acid, 60 mol % of allyl methacrylate, and 20 mol % of benzyl methacrylate |
| Hydridur ® 580 | Polymer dispersion (40% in water) from Air Products |
| Initiator 1 | 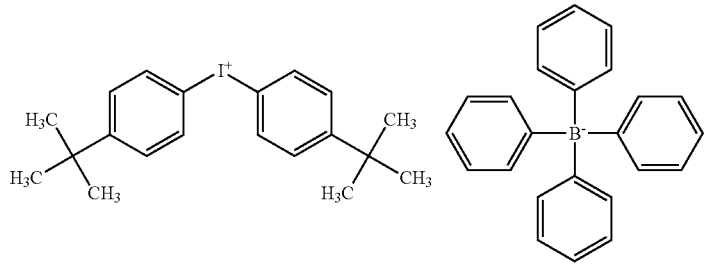 [SMILES: CC(C)(C)c1ccc([I+]c2ccc(C(C)(C)C)cc2)cc1 ; c1ccc([B-](c2ccccc2)(c2ccccc2)c2ccccc2)cc1] |
| Kayamer ™ PM-2 | Ester of 1 mol of phosphoric acid and 1.5 mol of hydroxyethyl methacrylate (Nippon Kayaku, Japan) |
| LUBA-print 499 | Dispersion of polyethylene wax (Muenzing, Germany) |
| Lutensol ® TO-10 | $C_{13}$ Oxo alcohol ethoxylate having 10 ethylene oxide groups (BASF, Germany) |
| Monomer 1 | Urethane methacrylate made from glycerol dimethacrylate, glycerol monomethacrylate, propylene glycol methacrylate and biuret of hexamethylene diisocyanate corresponding to oligomer m1 in EP 1,969,426 B1 |
| Monomer 2 | SR399 (dipentaerythriol pentaacrylate available from Sartomer) |
| Monomer 3 | CN2302 (hyperbranched polyester acrylate available from Sartomer) |
| Naxan ® ABL | Alkylated naphthalene sulfonate, sodium salt (Nease Corporation) |
| NK Ester BPE-500 | Ethoxylated Bisphenol A having methacrylic end groups (Shin Nakamura, Japan) |
| PVA 1 | Mowiol ® 4/98, poly(vinyl alcohol) from Kuraray, Germany, having a saponification degree of about 98% |
| PVA 2 | Poval ® 403, poly(vinyl alcohol) having a hydrolysis degree of 80% available from Kuraray, Germany |
| PVA 3 | CKS-50 (Nippon Gohsei, Japan) |
| PVA 4 | Nichigo G-Polymer AZF8035W (Nippon Gohsei, Japan) corresponding to a vinyl alcohol copolymer of the invention with recurring units (a), (b) and (c) wherein R' = R'' = $R_1$ = hydrogen, $R_2$ = a single bond, and having a saponification degree of 98.8%, an amount of 7.6 mol % of recurring unit (c), and a viscosity of 2.9 mPa*s at 20° C. for a 4% aqueous solution |
| PVA 5 | Nichigo G-Polymer OKS-8041, (Nippon Gohsei, Japan) corresponding to a vinyl alcohol copolymer of the invention with recurring units (a), (b) and (c) wherein R' = R'' = $R_1$ = hydrogen, $R_2$ = a single bond, and having a saponification degree of 89%, an amount of 7.9 mol % of recurring unit (c), and a viscosity of 3.1 mPa*s at 20° C. for a 4% aqueous solution |
| PVA 6 | Gohseran L-3266, poly(vinyl alcohol) modified with sulfonic acid groups, hydrolysis degree of 87% (available from Nippon Gohsei, Germany) |
| PVA 7 | Mowiol ® 4/88, poly(vinyl alcohol) having a hydrolysis degree of 88% (Kuraray, Germany) |
| PVA 8 | PVA with polyethylene oxide side chain, Ecomaty WO-320 R, saponification degree about 89% (Nippon Gohsei, Japan) |
| PVA 9 | PVA with polyethylene oxide side chain, Ecomaty WO-320 N, saponification degree about 99.7% (Nippon Gohsei, Japan) |

| | |
|---|---|
| Pigment 1 | Dispersion in propylene glycol monomethyl ether containing 9 weight % of copper phthalocyanine and 1 weight % of a poly(vinyl acetal) binder containing 39.9 mol % of vinyl alcohol, 1.2 mol % of vinyl acetate, 15.4 mol % of acetal groups from acetaldehyde, 36.1 mol % of acetal groups from butyraldehyde, and 7.4 acetal groups from 4-formylbenzoic acid |
| PVP K15 | Poly(vinyl pyrrolidone) from ISP, USA |
| Q-1301 | N-nitrosophenylhydroxylamine aluminum salt |
| Sensitizer 1 | 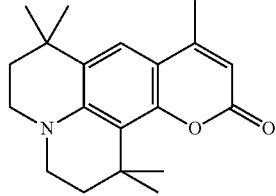 [SMILES: Cc1cc(=O)oc2c3c4c(cc12)C(C)(C)CCN4CCC3(C)C] |
| Sensitizer 2 | 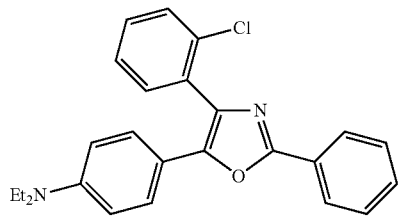 |
| Sensitizer 3 | 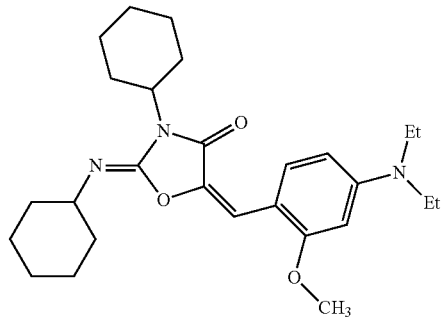 [SMILES: CCN(CC)c1ccc(/C=C2/O/C(=N\C3CCCCC3)N(C3CCCCC3)C2=O)c(OC)c1] |
| Sensitizer 4 | 1:2:1 molar mixture of: 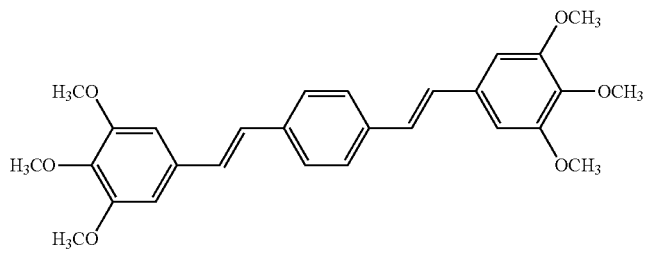 [SMILES: COc1cc(/C=C/c2ccc(/C=C/c3cc(OC)c(OC)c(OC)c3)cc2)cc(OC)c1OC] 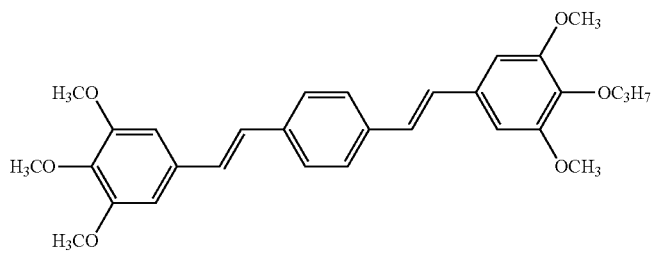 |

-continued

Sensitizer 5 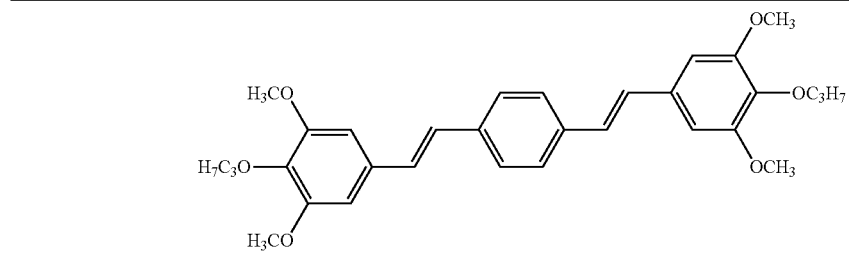

Sensitizer 6 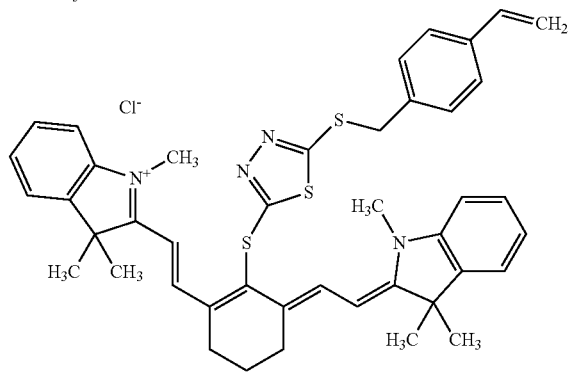

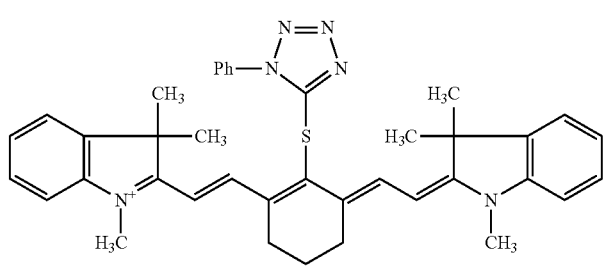

SH 1 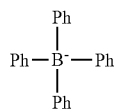

SH 2 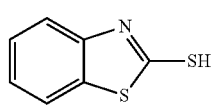

SH 3

| | |
|---|---|
| Sorbidex ™ 200 | Sorbitol from CG Germany |
| SR9053 | Mixture of an ethoxylated trimethylolpropantriacrylate and a trifunctional acidic ester from Sartomer |
| Surfynol ® 440 | Non-ionic surfactant from Air Products Inc. |
| Techpolymer SSX-105 | 5 μm Particles of a copolymer derived from methyl methacrylate and ethylene glycol methacrylate (SEIKISUI Plastics Europe, Netherlands) |

An aluminum-containing substrate was provided as an electrochemically roughened and anodized aluminum foil having an oxide weight of 3 g/m² that was subjected to a post-treatment using an aqueous solution of poly(vinyl phosphoric acid) to provide a surface with an average roughness of 0.55 μm.

Negative-working imageable layer radiation-sensitive formulations described below in TABLE II (405 nm sensitivity) and TABLE VIITABLE VII to TABLE IX (830 nm sensitivity) were applied to samples of the substrate after filtering using a wire bar coater. The imageable layer formulations were dried for 4 minutes at 90° C. to provide a dry coating weight of 1.7 g/m² of the 405 nm radiation-sensitive composition and 1.2 g/m² of the 830 nm radiation-sensitive composition.

Each dried imageable layer was overcoated with an aqueous solution using a wire bar coater to provide negative-working lithographic printing plate precursors having a dry outermost layer weight of 2 g/m² after drying for 4 minutes at 90° C. for the 405 nm radiation-sensitive composition (TABLE XX) and of 0.5 g/m² or 1.2 g/m² for the 830 nm radiation-sensitive composition as given in TABLE XXI.

Invention Examples 1-6 and Comparative Examples 1-6

Photospeed of 405 Nm Radiation-Sensitive Precursors

The UGRA/FOGRA Postscript Strip version 2.0 EPS (available from UGRA), which contains different elements for evaluating the quality of the copies, was used for imaging the lithographic printing plate precursors using a ProSetter platesetter from Heidelberger Druckmaschinen. The exposure wavelength was 405 nm and the energy was about 50 μJ/cm². The relative photospeed of the lithographic printing plate precursors was determined using an UGRA Offset test scale 1982 with overall exposure.

Processing Method 1 (405 Nm Exposed Precursors):

The imaged precursors of Invention Examples 1-4 and Comparative Examples 1, 4, and 6 were developed in a Raptor 68 Polymer processor from Glunz & Jenzen, Denmark, using the following processor settings:

Preheat temperature of 110° C.,
Prewash section with water recirculation,
Developer temperature of 23° C.,
Developer Kodak 206,
Regenerator Kodak 206R,
Regeneration rate of 40 ml/m²,
Post rinse section with water recirculation, and
Gumming section filled with Kodak 850S.

The photospeed was defined as the turning point of the O.D. versus log(exposure) curve. The results are summarized below in TABLE XX.

Processing Method 2 (405 Nm Exposed Plates):

The imaged precursors of Invention Examples 5 and 6 and Comparative Examples 2, 3, and 5 were preheated in an oven for 2 minutes at 90° C. and then processed in a single bath dip tank processor (dwell time of 20 seconds) having a developing bath equipped with two brushes and a drying unit using air of 65° C. The single bath processor was filled with gum developer having the composition shown in TABLE I:

TABLE I

| | |
|---|---|
| Water | 82.62 weight % |
| Ethylene glycol phenyl ether | 5.00 weight % |
| Tristyrylphenol ethoxylate (EO54) | 5.00 weight % |
| Diethanolamine | 2.00 weight % |
| Sorbidex ™ 200 | 5.00 weight % |
| Naxan ® ABL | 0.38 weight % |

The results from these examples are summarized below in TABLE XX.

Invention Examples 7-15 and Comparative Examples 7-12

Photospeed of 830 nm Radiation-Sensitive Precursors

The UGRA/FOGRA Postscript Strip version 2.0 EPS (available from UGRA), which contains different elements for evaluating the quality of the copies, was used for imaging the precursors of the Invention and Comparative Examples with a Trendsetter 3244 from Eastman Kodak Company at 830 nm. The exposure wavelength was 830 nm and the exposure energy was about 75 mJ/cm². The relative photospeed of the precursors was determined using an UGRA Offset test scale 1982 with overall exposure, and defined as the turning point of the OD vs. log(exposure) curve.

Processing Method 3 (830 nm Exposed Plates):

The imaged precursors of Invention Examples 7-9, 11-13, and 15 and Comparative Examples 7-12 were developed in a Kodak Thermal processor using the following processor settings:

Developer temperature 23° C.,
Developer Kodak SP500,
Replenishment rate 40 ml/m²,
Post rinse section with water recirculation, and
Gumming section filled with Kodak 850S.

The results are summarized below in TABLE XXI.

Processing Method 4 (830 nm Exposed Precursors):

The imaged precursors of Invention Examples 10-14 were processed in a single bath dip tank processor (dwell time of 20 seconds) having a developing bath equipped with two brushes and a air drying unit at 65° C. The single bath processor was filled with a gum developer having the composition described above in TABLE I. The results are summarized below in TABLE XXI.

Shelf Life Testing:

To provide an indication of the shelf life the lithographic printing plate precursors, the precursors were subjected to an accelerated aging test in a climate chamber for 10 days at 40° C. and 80% RH while wrapped in aluminized wrapping paper. The loss of tonal values of a 50% tint in a 150 lpi screen compared to the fresh plate was taken as a criterion. The following ratings regarding the thermal stability were made:

++ <0.25% change of tonal values; clean background,
+ <1% change of tonal values, clean background,
− background visible after inking, and
−− background visible before inking.

Run Length on Printing Press Testing:

Each lithographic printing plate was loaded in a sheet-fed offset printing machine using abrasive ink (Offset S 7184 available from Sun Chemical that contains 10% of calcium carbonate, and a fountain solution was Böttcher Fount S-3021 available from Böttcher GmbH). The run length was determined as the number of copies when the first sign of wear in the solid areas of the lithographic printing plate became visible.

++ more than 150,000 copies without visible solid wear were obtained,

+ between 100,000 and 150,000 copies without visible solid wear were obtained,

− between 80,000 and 100,000 copies without visible solid wear were obtained, and −− less than 80,000 copies without visible solid wear were obtained.

Developer Capacity:

Developer capacity was measured by loading of 15 m² of lithographic printing plates in 1 liter of developer (for the 405 nm radiation-sensitive lithographic printing plate precursors using a prewash step before development). The following ratings for the developer bath were given:

high very clean, no deposition, low viscosity of loaded developer, loading could have been continued, medium small depositions, medium viscosity, loading cycle could not be continued, low deposition, difficult to clean, high viscosity developer, plates were not clean after leaving the processor Latent Image Keeping (LIK):

The latent image keeping was evaluated using samples that were stored for 15 minutes after exposure at 22° C. and 60% relative humidity before processing. The change of total error, with total error being the sum of 5, 10, 20 to 90% screen tonal values at 150 lpi as measured by a Techkon Spektroplate, were estimated with the following ratings:

++ 0 to 9 units loss of total error,

+ 10 to 19 units loss of total error,

− 20 to 39 units loss of total error, and

−− more than 40 units loss of total error.

TABLE II

| 405 nm Radiation-Sensitive Imageable Layers | |
|---|---|
| 40 g | Propylene glycol monomethyl ether |
| 5 g | Acetone |
| 1.5 g | Binder shown in TABLE XX |
| 2.0 g | Pigment 1 |
| 0.05 g | Kayamer ™ PM-2 |
| 5.77 g | Monomer 1 |
| 0.35 g | HB-NK Ester PBE 500 |
| g | Sensitizer and amount shown in TABLE XX |
| 0.16 g | 2,2-Bis-(2-chlorophenyl)-4,5,4',5'-tetraphenyl-2'H-[1,2]biimidazolyl |
| g | Mercapto compound and amount in TABLE XX |
| 0.73 g | Q1301 (1 weight % solution in propylene glycol monomethyl ether) |

TABLE III

| Outermost Layer Composition 1 | |
|---|---|
| 25 g | Water |
| 56 g | 15 Weight % Solution of PVA 4 in water |
| 10 g | 15 Weight % Solution of PVP K15 in water |
| 0.083 g | 30 Weight % solution of Surfynol ® 440 in water |
| 0.057 g | Lutensol ® TO10 |

TABLE IV

| Outermost Layer Composition 2 | |
|---|---|
| 25 g | Water |
| 56 g | 15 Weight % solution of PVA 1 in water |
| 10 g | 15 Weight % solution of PVP K15 in water |

TABLE IV-continued

| Outermost Layer Composition 2 | |
|---|---|
| 0.083 g | 30 Weight % solution of Surfynol ® 440 in water |
| 0.057 g | Lutensol ® TO10 |

TABLE V

| Outermost Layer Composition 3 | |
|---|---|
| 25 g | Water |
| 56 g | 15 Weight % solution of PVA 3 in water |
| 10 g | 15 Weight % solution of PVP K15 in water |
| 0.083 g | 30 Weight % solution of Surfynol ® 440 in water |
| 0.057 g | Lutensol ® TO10 |

TABLE VI

| Outermost Layer Composition 3 | |
|---|---|
| 25 g | Water |
| 56 g | 15 Weight % solution of PVA 9 in water |
| 10 g | 15 Weight % solution of PVP K15 in water |
| 0.083 g | 30 Weight % solution of Surfynol ® 440 in water |
| 0.057 g | Lutensol ® TO10 |

TABLE VII

| 830 nm Radiation-Sensitive Imageable Layer | |
|---|---|
| 16 g | Butanone |
| 20 g | Propylene glycol monomethyl ether |
| 2 g | Water |
| 5 g | γ-butyrolactone |
| x g | Binder 1 |
| 3.61 g | Pigment 1 |
| 6.51 g | Monomer 2 (40 weight % in propylene glycol monomethyl ether) |
| 0.27 g | SR9053 |
| 0.13 g | Sensitizer 5 |
| 0.75 g | Hybridur ® 580 (40 weight % in water) |
| 0.39 g | Initiator 1 |

TABLE VIII

| 830 nm Radiation-Sensitive Imageable Layer | |
|---|---|
| 6.5 g | Butanone |
| 26.5 g | Propylene glycol monomethyl ether |
| 1.89 g | Binder 1 |
| 3.59 g | Pigment 1 |
| 5.77 g | Monomer 2 (40 weight % in propylene glycol monomethyl ether) |
| 0.27 g | SR9053 |
| 0.13 g | Sensitizer 5 |
| 1.99 g | Aerodisp ® 1030 |
| 0.39 g | Initiator 1 |

TABLE IX

| 830 nm Radiation-Sensitive Imageable layer | |
|---|---|
| 8 g | Butanone |
| 25 g | Propylene glycol monomethyl ether |
| 2.19 g | Binder 2 |
| 3.6 g | Pigment 1 |
| 4.02 g | Monomer 1 |
| 1.2 g | Monomer 3 |
| 0.15 g | PAM-100 |

TABLE IX-continued

830 nm Radiation-Sensitive Imageable layer

| | |
|---|---|
| 0.09 g | Sensitizer 3 |
| 2.0 g | Aerodisp ® 1030 |
| 0.39 g | Initiator 1 |

TABLE X

Outermost Layer Composition 4

| | |
|---|---|
| 115 g | Water |
| 6.13 g | PVA 5 |
| 0.013 g | Surfynol ® 440 |
| 0.65 g | 30 Weight % solution of Lutensol ® TO10 in water |

TABLE XI

Outermost Layer Composition 5

| | |
|---|---|
| 80 g | Water |
| 6.13 g | 15 Weight % solution of PVA 5 |
| 0.013 g | Surfynol ® 440 |
| 0.65 g | 30 Weight % solution of Lutensol ® TO10 in water |
| 0.24 g | LUBA-print 499 |

TABLE XII

Outermost Layer Composition 6

| | |
|---|---|
| 72 g | Water |
| 6.13 g | 15 Weight % solution of PVA 5 |
| 0.013 g | Surfynol ® 440 |
| 0.65 g | 30 Weight % solution of Lutensol ® TO10 in water |
| 10 g | 15 Weight % solution of PVP K15 in water |

TABLE XIII

Outermost Layer Composition 7

| | |
|---|---|
| 80 g | Water |
| 6.13 g | 15 Weight % solution of PVA 5 |
| 0.013 g | Surfynol ® 440 |
| 0.65 g | 30 Weight % solution of Lutensol ® TO10 in water |
| 0.8 g | Techpolymer SSX-105 |

TABLE XIV

Outermost Layer Composition 8

| | |
|---|---|
| 80 g | Water |
| 3.13 g | 15 Weight % solution of PVA 5 |
| 3.0 g | 15 Weight % solution of PVA 6 |
| 0.013 g | Surfynol ® 440 |
| 0.65 g | 30 Weight % solution of Lutensol ® TO10 in water |

TABLE XV

Outermost Layer Composition 9

| | |
|---|---|
| 80 g | Water |
| 6.13 g | 15 Weight % solution of PVA 2 |
| 0.013 g | Surfynol ® 440 |
| 0.65 g | 30 Weight % solution of Lutensol ® TO10 in water |

TABLE XVI

Outermost Layer Composition 10

| | |
|---|---|
| 80 g | Water |
| 6.13 g | 15 Weight % solution of PVA 7 |
| 0.013 g | Surfynol ® 440 |
| 0.65 g | 30 Weight % solution of Lutensol ® TO10 in water |

TABLE XVII

Outermost Layer Composition 11

| | |
|---|---|
| 80 g | Water |
| 6.13 g | 15 Weight % solution of PVA 2 |
| 0.013 g | Surfynol ® 440 |
| 0.65 g | 30 Weight % solution of Lutensol ® TO10 in water |
| 0.24 g | LUBA-print 499 |

TABLE XVIII

Outermost Layer Composition 12

| | |
|---|---|
| 72 g | Water |
| 6.13 g | 15 Weight % solution of PVA 2 |
| 0.013 g | Surfynol ® 440 |
| 0.65 g | 30 Weight % solution of Lutensol ® TO10 in water |
| 10 g | 15 Weight % solution of PVP K15 in water |

TABLE XIX

Outermost Layer Composition 13

| | |
|---|---|
| 115 g | Water |
| 6.13 g | PVA 8 |
| 0.013 g | Surfynol ® 440 |
| 0.65 g | 30 Weight % solution of Lutensol ® TO10 in water |

Invention Examples 1-6 that were imaged at 405 nm and Invention Examples 7-15 that were imaged at 830 nm showed positive effects when the outermost layer composition comprising modified poly(vinyl alcohol)s comprising 1,2-glycol units in side chains are present in the lithographic printing plate precursors. The resulting lithographic printing plates exhibited good developer capacity, good shelf life, no negative impact on photospeed, and high run length.

However, the Comparative Examples demonstrated that non-modified poly(vinyl alcohol)s (no functional groups other than recurring units derived from vinyl acetate for improving solubility in the developer) exhibited low developer capacities. The use of poly(vinyl alcohol)s having acidic groups and polyethylene glycol side chains exhibited medium developer capacities but also exhibited poor latent image keeping (in the 405 nm radiation-sensitive precursors) or inferior shelf life and run length of run (830 nm radiation-sensitive precursors).

TABLE XX

Precursors Imaged at 405 nm Using Imageable layer of TABLE II

| | Binder | Sensitizer | Mercapto-Compound (SH) | Outermost Layer Composition | Outermost Layer Weight | Relative Photo-speed | LIK | Processing Method | Shelf Life | Developer Capacity | Printing Durability |
|---|---|---|---|---|---|---|---|---|---|---|---|
| Invention Example 1 | 1 | 0.15 g of 1 | 0.05 g of 1 | TABLE III | 1.2 g/m² | 3.5 | ++ | 1 | ++ | High | + |
| Invention Example 2 | 1 | 0.60 g of 2 | 0.5 g of 2 | TABLE III | 1.2 g/m² | 3.7 | ++ | 1 | + | High | + |
| Invention Example 3 | 1 | 0.15 g of 3 | 0.05 g of 3 | TABLE III | 1.2 g/m² | 3.6 | ++ | 1 | + | High | + |
| Invention Example 4 | 1 | 0.15 g of 4 | 0.05 g of 1 | TABLE III | 1.2 g/m² | 3.6 | ++ | 1 | + | High | + |
| Invention Example 5 | 1 | 0.15 g of 1 | 0.05 g of 1 | TABLE III | 1.2 g/m² | 3.6 | ++ | 2 | + | Medium | + |
| Invention Example 6 | 1 | 0.60 g of 2 | 0.5 g of 2 | TABLE III | 1.2 g/m² | 3.8 | ++ | 2 | + | Medium | + |
| Comparative Example 1 | 1 | 0.15 g of 1 | 0.05 g of 1 | TABLE IV | 1.2 g/m² | 3.5 | ++ | 1 | + | Low | + |
| Comparative Example 2 | 1 | 0.15 g of 1 | 0.05 g of 1 | TABLE IV | 2.0 g/m² | 3.9 | ++ | 2 | + | Low | + |
| Comparative Example 3 | 1 | 0.15 g of 1 | 0.05 g of 1 | TABLE IV | 1.2 g/m² | 3.6 | ++ | 2 | + | Low | + |
| Comparative Example 4 | 1 | 0.15 g of 1 | 0.05 g of 1 | TABLE V | 1.2 g/m² | 3.5 | + | 1 | − | Medium | + |
| Comparative Example 5 | 1 | 0.15 g of 1 | 0.05 g of 1 | TABLE V | 1.2 g/m² | 3.6 | + | 2 | − | Medium | + |
| Comparative Example 6 | 1 | 0.15 g of 1 | 0.05 g of 1 | TABLE VI | 1.2 g/m² | 3.3 | − | 1 | + | Medium | + |

TABLE XXI

Precursors Imaged at 830 nm Using Various Imageable Layers

| | Imageable Layer | Outermost Layer Composition | Processing Method | Outermost Layer Weight | Relative Photo-speed | Shelf life | Developer capacity | Print durability |
|---|---|---|---|---|---|---|---|---|
| Invention Example 7 | TABLE VII | TABLE X | 3 | 0.5 g/m² | 3.4 | ++ | High | ++ |
| Invention Example 8 | TABLE VIII | TABLE X | 3 | 0.5 g/m² | 3.2 | ++ | High | ++ |
| Invention Example 9 | TABLE VIII | TABLE XI | 3 | 0.5 g/m² | 3.1 | ++ | High | ++ |
| Invention Example 10 | TABLE VIII | TABLE XI | 4 | 0.5 g/m² | 3.3 | ++ | High | + |
| Invention Example 11 | TABLE VIII | TABLE XII | 3 | 0.5 g/m² | 3.1 | ++ | High | ++ |
| Invention Example 12 | TABLE VIII | TABLE XIII | 3 | 0.5 g/m² | 3.3 | ++ | High | ++ |
| Invention Example 13 | TABLE IX | TABLE X | 3 | 1.2 g/m² | 3.5 | ++ | High | ++ |
| Invention Example 14 | TABLE IX | TABLE X | 4 | 1.2 g/m² | 3.6 | ++ | High | + |
| Invention Example 15 | TABLE IX | TABLE XIV | 3 | 1.2 g/m² | 3.4 | ++ | High | ++ |
| Comparative Example 7 | TABLE VII | TABLE XV | 3 | 0.5 g/m² | 3.0 | − | Low | ++ |
| Comparative Example 8 | TABLE VIII | TABLE XV | 3 | 0.5 g/m² | 2.9 | − | Low | ++ |
| Comparative Example 9 | TABLE IX | TABLE XVI | 3 | 1.2 g/m² | 3.1 | − | Low | + |
| Comparative Example 10 | TABLE VIII | TABLE XVII | 3 | 0.5 g/m² | 2.9 | + | Low | + |
| Comparative Example 11 | TABLE VIII | TABLE XVIII | 3 | 0.5 g/m² | 2.8 | + | Low | + |
| Comparative Example 12 | TABLE VIII | TABLE XIX | 3 | 0.5 g/m² | 3.0 | − | Medium | − |

The invention has been described in detail with particular reference to certain preferred embodiments thereof, but it will be understood that variations and modifications can be effected within the spirit and scope of the invention.

The invention claimed is:

1. A method for providing a lithographic printing plate, comprising:

imagewise exposing a negative-working lithographic printing plate precursor that comprises a substrate, a negative-working radiation-sensitive imageable layer, and an aqueous solution soluble outermost layer to imaging radiation to provide exposed regions and non-exposed regions in the negative-working radiation-sensitive imageable layer, and removing the aqueous solution soluble outermost layer and the non-exposed regions of the negative-working radiation-sensitive imageable layer, wherein the negative-working radiation-sensitive imageable layer comprises a free radically polymerizable compound, a radiation absorber, a compound to generate free radicals upon irradiation, and a polymeric binder, and the aqueous solution soluble outermost layer comprising a first vinyl alcohol copolymer comprising at least one unit of each of the following (a), (b), and (c) recurring units, in any order:

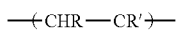
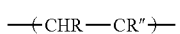

wherein R, R', and R" are independently hydrogen or a substituted or unsubstituted alkyl group having 1 to 4 carbon atoms, $R_1$ is hydrogen or a substituted or unsubstituted alkyl group having 1 to 4 carbon atoms, $R_2$ represents a single connecting bond or a substituted or unsubstituted alkylene or cycloalkylene group, wherein the (c) recurring units are present in an amount of at least 0.5 mol %, based on the total recurring units in the first vinyl alcohol copolymer.

2. The method of claim 1, wherein R, R', and R" are independently hydrogen or a methyl group, $R_1$ is hydrogen or a methyl group, and $R_2$ is a single connecting bond or a substituted or unsubstituted alkylene group having 1 to 3 carbon atoms.

3. The method of claim 1, wherein the (a) recurring units are present in an amount of at least 40 mol % and up to and including 99.4 mol %, the (b) recurring units are present in an amount of at least 0.1 mol % and up to and including 40 mol %, and the (c) recurring units are present in an amount of at least 0.5 mol % and up to and including 20 mol %, based on the total recurring units in the first vinyl alcohol copolymer.

4. The method of claim 1, wherein the (a) recurring units are present in an amount of at least 70 mol % and up to and including 98.8 mol %, the (b) recurring units are present in an amount of at least 0.1 mol % and up to and including 20 mol %, and the (c) recurring units are present in an amount of at least 1 mol % and up to and including 10 mol %, based on the total recurring units in the first vinyl alcohol copolymer.

5. The method of claim 1, wherein R, R', R", and $R_1$ are each hydrogen, and $R_2$ is a single connecting bond or methylene.

6. The method of claim 1, wherein the first vinyl alcohol copolymer is present in the aqueous solution soluble outermost layer in an amount of at least 40 weight % and up to and including 100 weight %, based on the total aqueous solution soluble outermost layer dry weight.

7. The method of claim 1, wherein the aqueous solution soluble outermost layer is disposed directly on the negative-working radiation-sensitive imageable layer.

8. The method of claim 1, wherein the aqueous solution soluble outermost layer is present in the negative-working lithographic printing plate precursor in a dry amount of at least 0.1 g/m$^2$ and up to and including 4 g/m$^2$.

9. The method of claim 1, wherein the radiation absorber is sensitive at a peak wavelength of at least 150 nm to and including 1500 nm.

10. The method of claim 1, wherein the aqueous solution soluble outermost layer further comprises a second vinyl alcohol copolymer comprising at least one of the (a), (b), and (c) recurring units, respectively, in any order, wherein the ratio of the (b) recurring units in the first vinyl alcohol copolymer to the (b) recurring units in the second vinyl alcohol copolymer is at least 1.1:1.

11. The method of claim 1, wherein the substrate is a grained and anodized aluminum-containing substrate, the radiation absorber is an infrared radiation absorber, the compound to generate free radicals is an onium compound, and the first vinyl alcohol copolymer comprises at least one unit of each of the following (a), (b), and (c) recurring units, in any order:

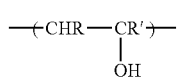
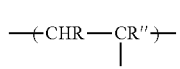
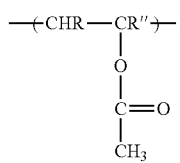
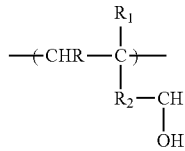

wherein R, R', and R" are independently hydrogen or a methyl group, $R_1$ is hydrogen or a methyl group, $R_2$ is a single connecting bond or a substituted or unsubstituted alkylene group having 1 to 3 carbon atoms, based on the total recurring units in the first vinyl alcohol copolymer, wherein the (a) recurring units are present in an amount of at least 70 mol % and up to and including 98.8 mol %, the (b) recurring units are present in an amount of at least 0.1 mol % and up to and including 20 mol %, and the (c) recurring units are present in an amount of at least 1 mol % and up to and including 10 mol %, the first vinyl alcohol copolymer is present in the aqueous solution soluble outermost layer in an amount of at least 60 weight % and up to and including 100 weight %, based on the total aqueous solution soluble outermost layer dry weight, and the aqueous solution soluble outermost layer is present in a dry amount of at least 0.2 g/m² and up to and including 2.5 g/m².

12. The method of claim 1, wherein the substrate is a grained and anodized aluminum-containing substrate, the radiation absorber is a sensitizer for imaging radiation of at least 350 nm to and including 450 nm, and the first vinyl alcohol copolymer comprises at least one unit of each of the following (a), (b), and (c) recurring units, in any order:

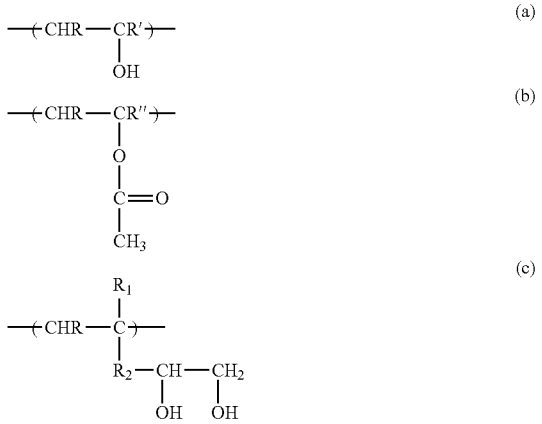

wherein R, R', and R" are independently hydrogen or a methyl group, $R_1$ is hydrogen or a methyl group, $R_2$ is a single connecting bond or a substituted or unsubstituted alkylene group having 1 to 3 carbon atoms, based on the total recurring units in the first vinyl alcohol copolymer, wherein the (a) recurring units are present in an amount of at least 70 mol % and up to and including 98.8 mol %, the (b) recurring units are present in an amount of at least 0.1 mol % and up to and including 20 mol %, and the (c) recurring units are present in an amount of at least 1 mol % and up to and including 10 mol %, the first vinyl alcohol copolymer is present in the aqueous solution soluble outermost layer in an amount of at least 60 weight % and up to and including 100 weight %, based on the total aqueous solution soluble outermost layer dry weight, and the aqueous solution soluble outermost layer is present in a dry amount of at least 0.2 g/m² and up to and including 2.5 g/m².

13. The method of claim 1, wherein imagewise exposing is carried out using imaging radiation at a wavelength of either from 150 nm to and including 475 nm, or from 750 nm to and including 1500 nm.

14. The method of claim 1, wherein removing the aqueous solution soluble outermost layer and the non-exposed regions of the negative-working radiation-sensitive imageable layer is carried out off-press using an aqueous solution having a pH of at least 5 to and including 13.

15. The method of claim 1, wherein removing the aqueous solution soluble outermost layer and the non-exposed regions of the negative-working radiation-sensitive imageable layer is carried out off-press using an aqueous solution that also provides a protective coating on the lithographic printing plate.

16. The method of claim 1, wherein the lithographic printing plate is used for lithographic printing without further treatment with a solution off-press.

17. The method of claim 1, wherein the removing the aqueous solution soluable outermost layer and the non-exposed regions of the negative-working radiation-sensitive imageable layer is carried out on-press using a lithographic printing ink, fountain solution, or both.

* * * * *